(12) United States Patent
Yoshinaga et al.

(10) Patent No.: US 8,304,667 B2
(45) Date of Patent: Nov. 6, 2012

(54) MULTILAYER PRINTED CIRCUIT BOARD

(75) Inventors: Takashi Yoshinaga, Tokyo (JP); Kenji Kataoka, Tokyo (JP); Michihito Otsuki, Tokyo (JP)

(73) Assignee: NEC Corporation, Tokyo (JP)

( * ) Notice: Subject to any disclaimer, the term of this patent is extended or adjusted under 35 U.S.C. 154(b) by 83 days.

(21) Appl. No.: 12/920,426

(22) PCT Filed: Mar. 24, 2009

(86) PCT No.: PCT/JP2009/055789
§ 371 (c)(1),
(2), (4) Date: Aug. 31, 2010

(87) PCT Pub. No.: WO2009/119562
PCT Pub. Date: Oct. 1, 2009

(65) Prior Publication Data
US 2011/0011637 A1    Jan. 20, 2011

(30) Foreign Application Priority Data

Mar. 28, 2008 (JP) ................................ 2008-086209

(51) Int. Cl.
*H05K 1/11* (2006.01)
(52) U.S. Cl. ...................................... 174/262; 361/760
(58) Field of Classification Search .................. 174/255, 174/257, 258, 261, 262; 361/780, 794, 760, 361/772; 257/508, 774, 686
See application file for complete search history.

(56) References Cited

U.S. PATENT DOCUMENTS

| | | | |
|---|---|---|---|
| 6,787,710 B2 * | 9/2004 | Uematsu et al. | 174/261 |
| 7,317,166 B2 * | 1/2008 | Nakamura | 174/262 |
| 7,405,947 B1 * | 7/2008 | Goergen | 361/788 |
| 7,767,913 B2 * | 8/2010 | Corisis et al. | 174/262 |
| 8,084,839 B2 * | 12/2011 | Choi et al. | 257/508 |
| 2002/0176236 A1 | 11/2002 | Iguchi et al. | |
| 2007/0136618 A1 | 6/2007 | Ohsaka | |

FOREIGN PATENT DOCUMENTS

| | | |
|---|---|---|
| JP | 2000-208939 A | 7/2000 |
| JP | 2001-060770 A | 3/2001 |
| JP | 2003-031945 A | 1/2003 |
| JP | 2003-163467 A | 6/2003 |
| JP | 2005-064028 A | 3/2005 |
| JP | 2007-165483 A | 6/2007 |
| JP | 2007-250645 A | 9/2007 |

* cited by examiner

*Primary Examiner* — Yuriy Semenenko
(74) *Attorney, Agent, or Firm* — Sughrue Mion, PLLC

(57) ABSTRACT

A multilayer printed circuit board, including: a signal interconnection which transmits and receives an electrical signal between electronic components; a ground interconnection connected to a ground of a circuit; a power interconnection connected to a power layer to supply power to electronic components; at least one ground layer installed in an inner layer; at least one clearance which passes through the ground layer; and a ground via which connects the ground interconnection with the ground layer. The signal interconnection and the ground interconnection or the signal interconnection and the power interconnection are installed in a pair, and a pair of interconnection vias for interlayer connection are inserted through the clearance installed in the ground layer so that one of the pair of interconnection vias is connected to the ground layer by the ground interconnection.

3 Claims, 9 Drawing Sheets

MULTILAYER PRINTED CIRCUIT BOARD

BACKGROUND OF THE INVENTION

1. Technical Field

The present invention relates to a multilayer printed circuit board (referred to as a "multilayer PCB"), and more particularly, to a multilayer printed circuit board capable of reducing overlapping of external electromagnetic noise at interconnections including via connections between layers.

This application claims priority to and the benefit of Japanese Patent Applications No. 2008-086209 filed on Mar. 28, 2008, the disclosure of which is incorporated herein by reference.

2. Description of the Related Art

In a conventional multilayer printed circuit board (PCB), interconnections having via connections are generally provided between large-scale integrations (LSIs), or the like, mounted on a board.

Such a conventional multilayer PCB has, for example, a double-sided mounting structure in which components of the LSI, or the like, are disposed on both surfaces thereof, as shown in FIG. 9. In addition, similarly, even in the multilayer PCB in which components are mounted on one surface thereof, in order to efficiently mount a plurality of interconnections with a high density, the interconnections are performed by via connections.

Meanwhile, in the multilayer PCB, it is known that the interconnection is affected by electromagnetic noise when the above-mentioned via connection is performed. As an example of such a problem, the problem that the characteristics are deteriorated due to the via connection with regard to noise leakage to the exterior is disclosed in the following Patent Document 1 (for example, refer Paragraphs 0007 to 0010 of Patent Document 1).

In the technique disclosed in Patent Document 1, in order to solve the above-mentioned problem, an interconnection structure shown in FIG. 10 has been proposed. In Patent Document 1, vias 341 and 342 in contact with each other near a clearance are disposed between layers having the clearance, through which a via interconnection passes. These additional vias are used as a part of a feedback circuit of the corresponding interconnection, thereby improving noise characteristics.

In addition, in Patent Document 2, with regard to a technique of via connection, a structure for reducing noise transmitted through vias has been proposed (see also FIG. 11). In Patent Document 2, the vias are not disposed in a straight line, but they are disposed at different levels at predetermined intervals like the vias 422 and 423 shown in FIG. 11. As a result, the noise transmitted through the vias can be reduced. In addition, in Patent Document 2, an interconnection 421 is installed to connect the vias 422 and 423.

Further, in addition to the techniques disclosed in Patent Documents 1 and 2, various electromagnetic compatibility improvement countermeasures using many electronic components such as a filter circuit, or the like, are used as general noise solutions when via connection is provided on a multilayer PCB.

However, the multilayer PCB used in the related art has the following problems.

First, when external electromagnetic noise such as electrostatic discharge noise, or the like, is applied to a ground of the multilayer PCB, noise is induced between the interconnection and the ground of the via connection by noise current flowing to the ground.

This phenomenon is attributed to the ground of the LSI from and to which the interconnection is extracted, differential mode noise of coupling paths caused by applying the noise to the corresponding interconnection, or the like. Detailed descriptions thereof will be made below.

Second, coupling of the electrostatic discharge noise may be generated by radiation in the air of noise application places, i.e., by an electromagnetic field of external noise. Coupling of the electromagnetic field noise of the radiation in the air may also be easily generated at the via portion.

In order to solve the second problem, techniques of reducing noise discharged to the exterior due to current flowing through a circuit have been proposed. The techniques are disclosed in Patent Documents 1 and 2.

However, while the techniques of Patent Documents 1 and 2 show a certain effect even on influence of a circuit current caused by the external noise because of its reversibility, they are not effective against the above-mentioned first problem of a different noise coupling mechanism.

In addition, when an additional filter circuit is used, there is a possibility of causing new problems such as an increase in price due to addition of components thereof, provision of component disposition places, a reduction in residual energy due to electrical loss of components constituting the filter circuit, or the like.

Patent Document 1: Japanese Unexamined Patent Publication, First Publication No. 2007-250645
Patent Document 2: Japanese Unexamined Patent Publication, First Publication No. 2000-208939

SUMMARY OF THE INVENTION

Problem to be Solved by the Invention

The invention has been achieved in view of the above circumstances, and it is an object of the present invention to provide a multilayer printed circuit board capable of reducing a space, low cost, removing necessity of residual energy, and reducing overlapping of noise to via-connected interconnections with external noise such as electrostatic discharge noise.

Means for Solving the Problem (1) The present invention has been made to solve the above-described problems. According to an aspect of the present invention, there is provided a multilayer printed circuit board, including: a signal interconnection which transmits and receives an electrical signal between electronic components; a ground interconnection connected to a ground of a circuit; a power interconnection connected to a power layer to supply power to electronic components; at least one ground layer installed in an inner layer; at least one clearance which passes through the ground layer; and a ground via which connects the ground interconnection with the ground layer, wherein the signal interconnection and the ground interconnection or the signal interconnection and the power interconnection are installed in a pair, and a pair of interconnection vias for interlayer connection are inserted through the clearance installed in the ground layer so that one of the pair of interconnection vias is connected to the ground layer by the ground interconnection.

(2) In the multilayer printed circuit board according to the aspect of the present invention, the multilayer printed circuit board may include at least two kinds of power sources separated in terms of direct current, and the power interconnection may supply at least part of power supplied to the electronic component to which the other interconnection paired with the power interconnection is connected.

(3) In the multilayer printed circuit board according to the aspect of the present invention, when at least two interconnection vias are disposed adjacent to each other and are inserted through the clearance installed in the ground layer, the pair of interconnection vias may be disposed with the other interconnection vias being not disposed in a straight line connecting center points of the pair of interconnection vias, and the pair of interconnection vias may have a gap smaller than that of the other interconnection vias.

Effect of the Invention

According to a multilayer printed circuit board of the present invention, as described above, a pair of interconnection vias for interlayer connection are inserted through the same clearance installed in a ground layer so that one of the pair of interconnection vias is connected to the ground layer of an inner layer through a ground interconnection.

For this reason, a good feedback circuit can be formed to suppress noise induction caused by external noise such as electrostatic discharge noises, or the like. As a result, the noise discharge to the exterior can be reduced to improve noise characteristics of the external electromagnetic environment, thereby providing electronic devices having improved immunity to external noises.

In addition to the above effects, there is no necessity to add electronic components, and the number of components can be reduced. As such, it is possible to implement a multilayer printed circuit board, which is capable of reducing a space, low cost, removing necessity of residual energy, and providing improved immunity characteristics.

REFERENCE SYMBOLS 1, 10: Multilayer printed circuit board (Multilayer PCB)
2: First layer (Interconnection layer)
4: Fourth layer (Interconnection layer)
5, 53, 73: Ground via
7, 17, 57, 77: Clearance
10b, 10c, 31, 32: Ground layer
11, 19, 21, 41, 50, 70: Signal interconnection
12, 13: Power interconnection
15, 18, 81, 82: LSI
16a, 16b, 54, 44, 61, 62, 74, 75: Interconnection via
22, 42, 51, 71: Ground interconnection

DETAILED DESCRIPTION OF THE INVENTION

Hereinafter, a multilayer printed circuit board (multilayer PCB) 1 in accordance with an embodiment of the present invention will be described in detail with reference to FIGS. 1 to 7. In addition, the multilayer PCB will be described with reference to FIGS. 8 to 11 as necessary.

The drawings referenced in the following description are used to describe the multilayer PCB in accordance with an embodiment of the present invention, and sizes, thicknesses and dimensions of the shown respective components may be different from actual dimensions.

Figure 1:
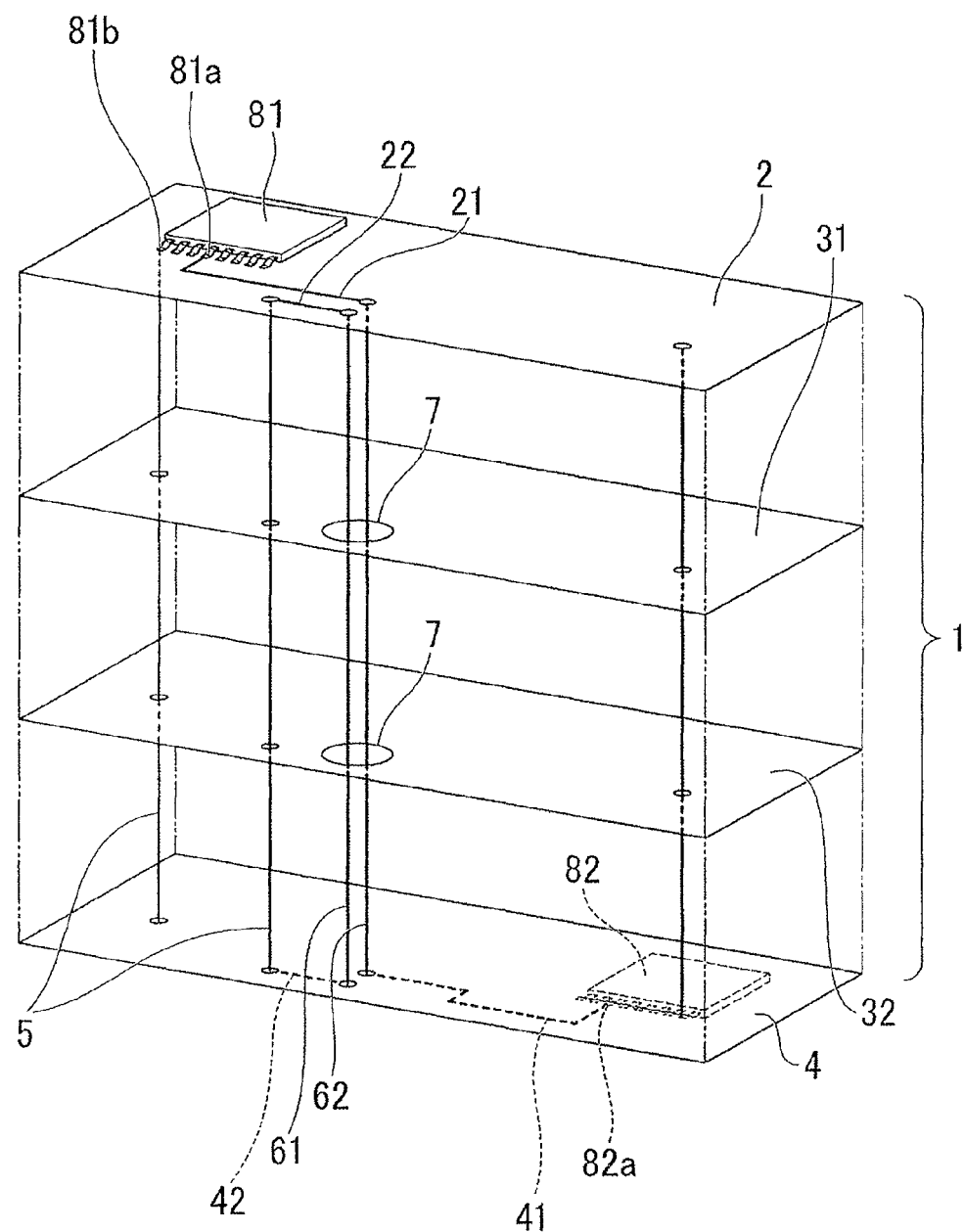
FIG. 1 is a cross-sectional view showing an example of a multilayer printed circuit board in accordance with an embodiment of the present invention, showing a layer structure.

As shown in FIG. 1, the multilayer PCB 1 of this embodiment includes signal interconnections 21 and 41 which transmits and receiving an electric signal between electronic components, a ground interconnection 22 connected to the ground of a circuit, and a power interconnection (see FIG. 2) connected to a power layer to supply power to the electronic components, which are mounted on the multilayer PCB 1.

The multilayer PCB 1 includes one or more ground layers 31 and 32 in an inner layer. At least one clearance 7 is installed to pass through the ground layers 31 and 32. In addition, the ground interconnection 22 is connected to the ground layers 31 and 32 by the ground via 5. The signal interconnection 21 and the ground interconnection 22, or the signal interconnection 21 and the power interconnection (see FIG. 2) are installed in a pair.

A pair of interconnection vias 61 and 62 are inserted through the same clearance 7, which is installed at the ground layers 31 and 32, to be connected between the layers. One of the pair of interconnection vias 61 and 62, the interconnection via 61 in the shown example, is connected to the ground layers 31 and 32 by the ground interconnection 22 and the ground via 5.

The multilayer PCB 1 of this embodiment, in which LSIs 81 and 82 are connected to the multilayer PCB, has the following constitutions (1) to (3).

(1) It is provided along the pair of interconnection vias 61 and 62.

(2) The interconnection vias 61 and 62 are disposed to pass through the clearance 7.

(3) One 61 of the interconnection vias is connected to the ground layers 31 and 32 by the ground interconnection 22 and the ground via 5.

The multilayer PCB 1 of this embodiment shown in FIG. 1 has a four-layer structure, in which signal interconnections are installed at a first layer (interconnection layer) 2 and a fourth layer (interconnection layer) 4, the ground layer 31 is disposed at a second layer, and the ground layer 32 is disposed at a third layer.

The multilayer PCB 1 is a double-sided mounting substrate, in which the LSI 81 is mounted on the first layer (interconnection layer) 2 and the LSI 82 is mounted on the fourth layer (interconnection layer) 4. In addition, the first layer (interconnection layer) 2 and the fourth layer (interconnection layer) 4 are connected to each other by the interconnection vias 61 and 62.

In addition, in the drawings referenced in the embodiment including FIG. 1, the constitution of power distribution, other signal interconnections, some of the plurality of ground vias 5 connected to the ground layer 31 and the ground layer 32, and other components that are not essential for the purpose of description, are omitted.

The above-mentioned multilayer PCB 1 has an interconnection via 62 which connects the signal interconnection 21 with the signal interconnection 41. When the signal interconnection 21 and the signal interconnection 41 are connected to each other, the clearances 7 through which a conductor passes are installed to avoid interference with the ground layers 31 and 32.

The multilayer PCB 1 of this embodiment has the interconnection via 61 installed along the interconnection via 62. The interconnection via 61 has a ground function because it is connected to the ground layers 31 and 32. As a result, the interconnection via 61 and the ground layers 31 and 32 are connected to each other using the ground via 5 and the ground interconnection 22.

In addition, the multilayer printed circuit board in accordance with the embodiment of the present invention may use conventional designs and manufacturing methods, without applying any limitations, special techniques, or the like.

The multilayer printed circuit board 1 of this embodiment having the above-mentioned constitution can suppress generation of noise coupling due to via connection, thereby reducing the noise discharge to the exterior.

Figure 9:
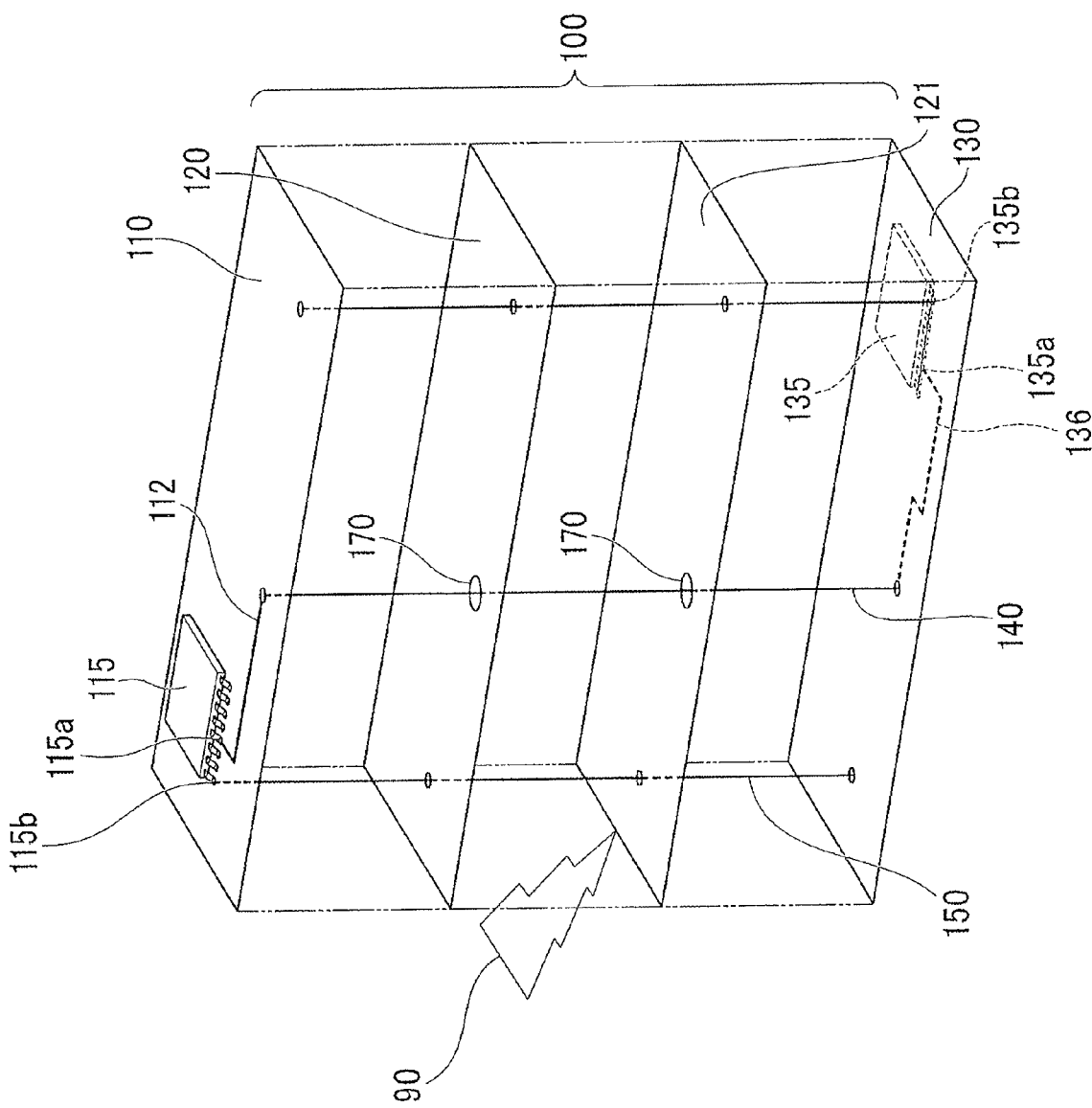
FIG. 9 is a view showing a conventional multilayer printed circuit board.
Figure 10:
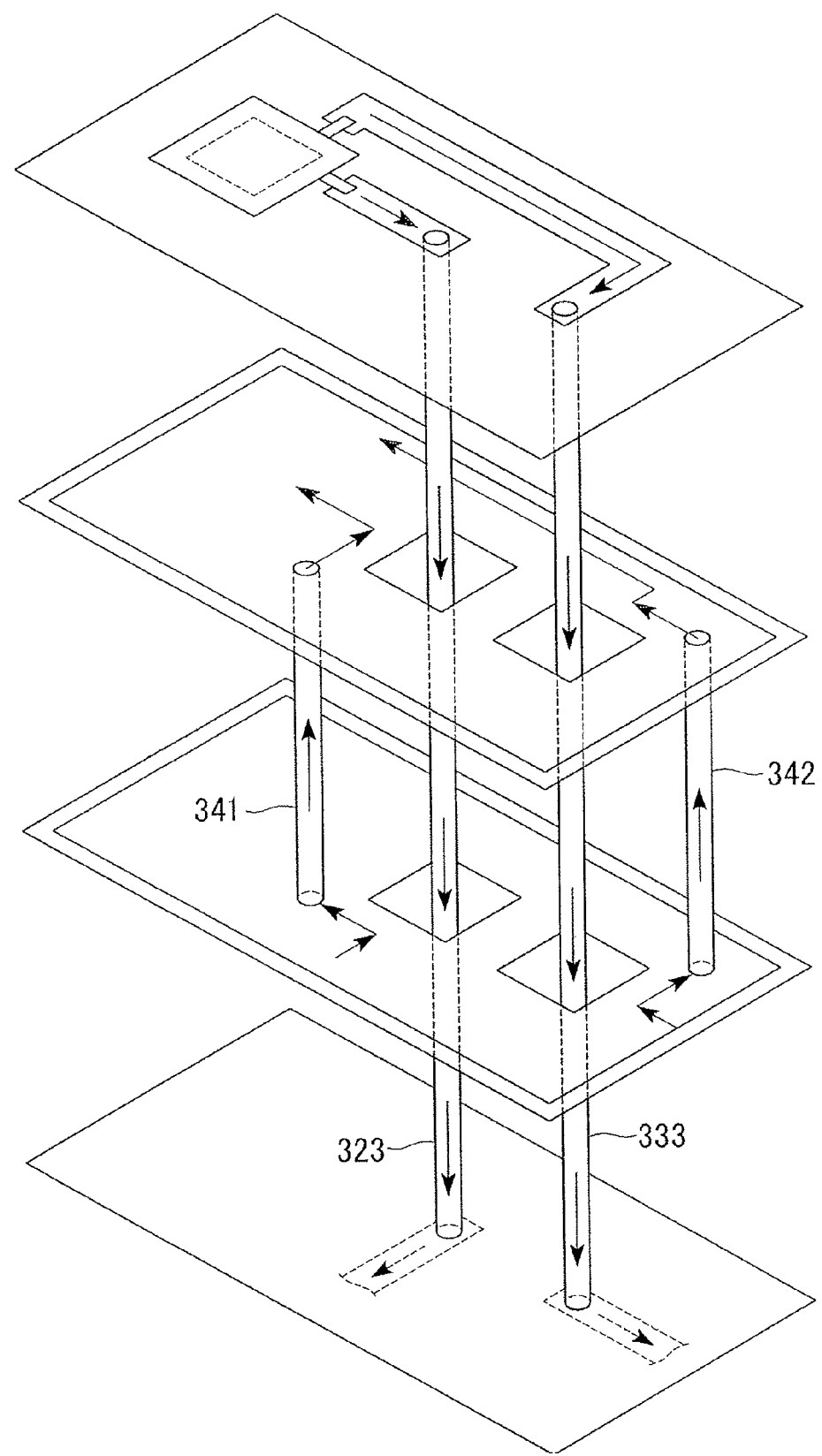
FIG. 10 is a view showing a conventional multilayer printed circuit board.
Figure 11:
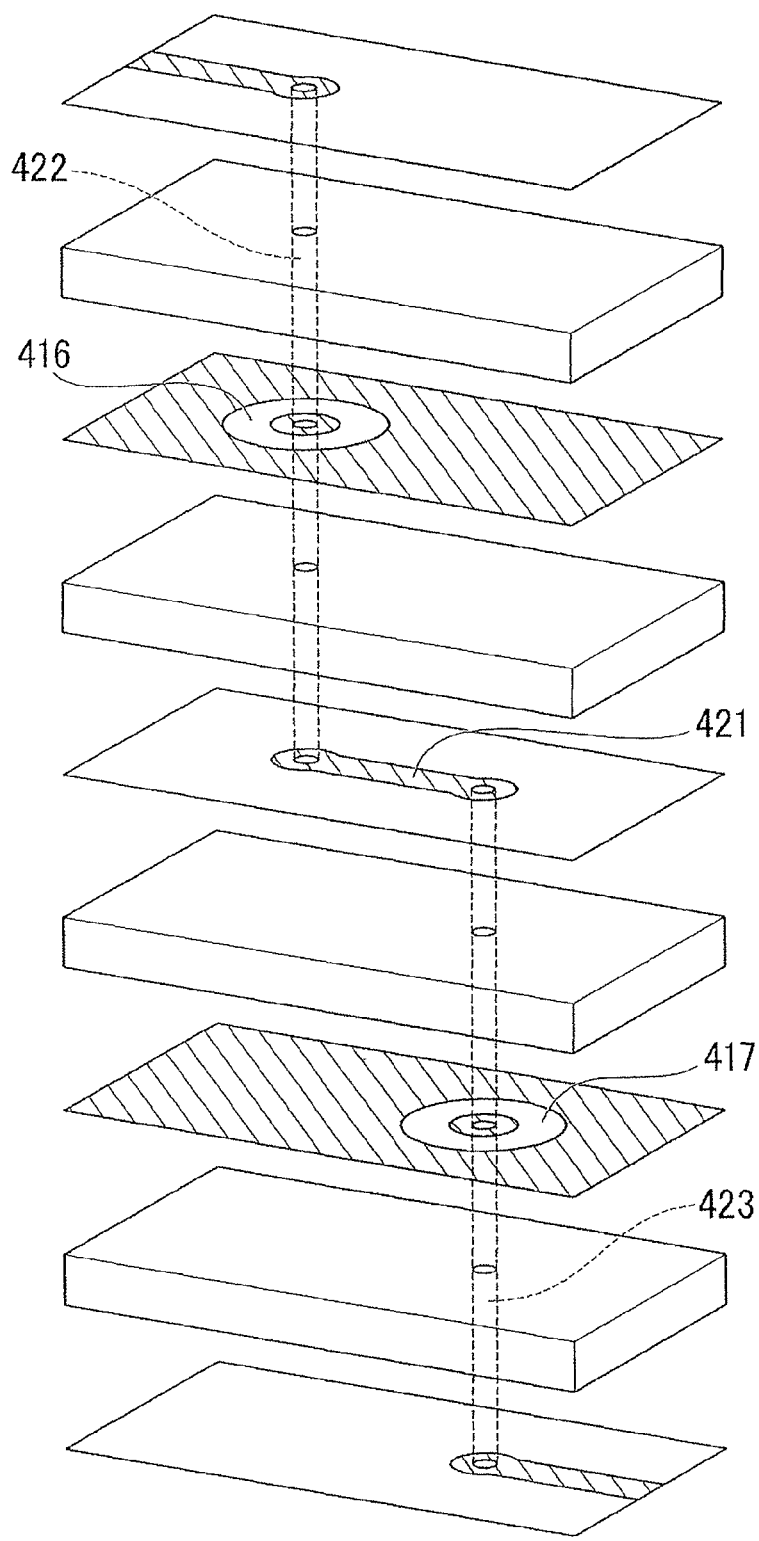
FIG. 11 is a view showing a conventional multilayer printed circuit board.

Here, a noise coupling mechanism will be described with reference to FIG. 9 showing the related art.

As shown in FIG. 9, when an external noise 90 is applied to ground layers 120 and 121 of a multilayer printed circuit board (multilayer PCB) 100, the voltage level of a ground terminal 115*b* of an LSI 115 is directly fluctuated.

Meanwhile, an interconnection 112 on an interconnection layer 110 affected by the external noise 90, which is transmitted to the ground layers 120 and 121, at clearances 170, and affects it to an LSI 115 and an LSI 135.

As a result, a phase difference caused by the difference between coupling paths, and differential mode noise between coupling levels occur. For this reason, in the LSI 115 and the LSI 135, a potential difference, i.e. noise, is generated between interconnection terminals 115*a* and 135*a* and ground terminals 115*b* and 135*b*.

In the case of a constitution having no via connection, no coupling occurs at the clearance portion. For this reason, the ground and the interconnection are matched with each other by floating capacity therebetween, and thus are affected by the noise. As a result, induction of the noise between the LSI terminals is suppressed less than in the case where the via connection exists, without causing a phase difference therebetween.

As described above, the difference resulting from existence/absence of the via connection will be described with reference to electromagnetic field simulation results shown in a graph of FIG. 5.

Figure 5:
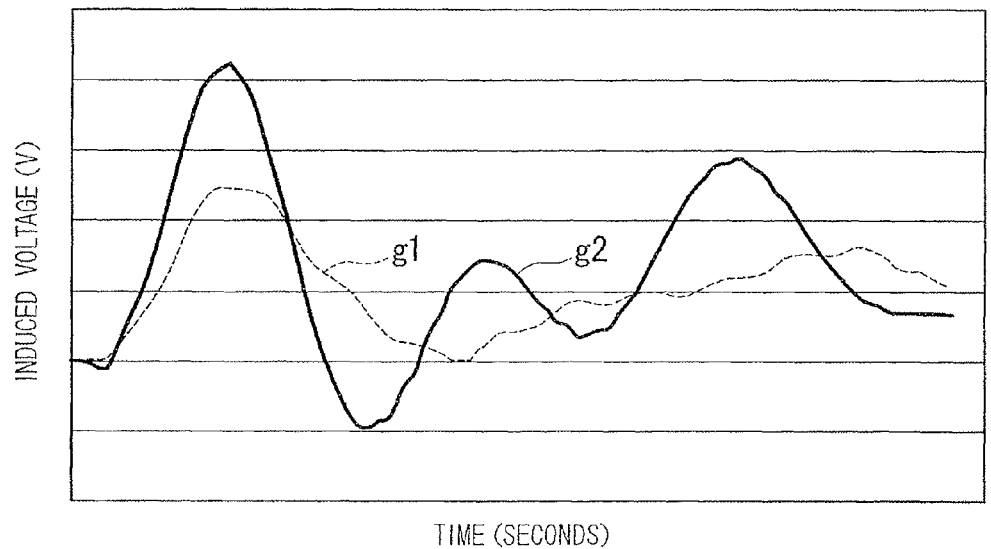
FIG. 5 is a graph relating a conventional multilayer printed circuit board, showing noise overlapping caused by vias.
Figure 8:
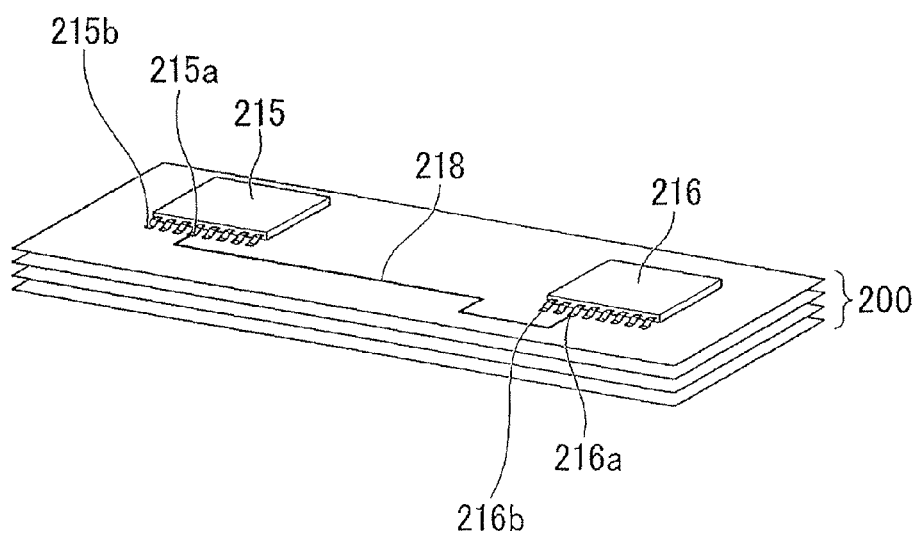
FIG. 8 is a view showing a conventional multilayer printed circuit board.

In the graph of FIG. 5, there are shown induced voltages when the external noise 90 was applied to a conventional multilayer PCB 200 in which the via connection is not performed as shown in FIG. 8 and a conventional multilayer PCB 100 in which the via connection is performed as shown in FIG. 9. Here, in LSIs 115, 135, 215 and 216, voltages induced between the interconnection terminals 115*a*, 135*a*, 215*a* and 216*a* and the ground terminals 115*b*, 135*b*, 215*b* and 216*b* are calculated.

In FIG. 5, the horizontal axis represents time (seconds), and the vertical axis represents an induced voltage (V). A graph g1 shows a case where there is no via connection. A graph g2 shows a case where there is a via connection.

As can be seen from the results shown in the graph of FIG. 5, the induced voltage was increased by providing the via connection in the conventional multilayer printed circuit board. Here, the conventional multilayer PCB 100 shown in FIG. 9 shows a structure in which the layers are exploded for the convenience of description. However, the multilayer PCB 200 shown in FIG. 8 has the same structure as FIG. 9, except that the LSI has a double-sided mounting surface instead of a one-sided mounting surface and that the via is installed.

As described above, in the noise coupling of the via, an effective noise countermeasure is to suppress the noise coupling at the clearance 170. Specifically, for example, one effective countermeasure is to reduce the noise coupling by increasing a diameter of the clearance 170 and reducing electrostatic coupling of the interconnection via 140 to which the ground layers 120 and 121 and the interconnection 112 are connected.

However, when the diameter of the clearance 170 is increased, the feedback circuit, in which the effects disclosed in Patent Document 1 are expected, is separated from the interconnection 112. For this reason, the noise discharge to the exterior cannot be reduced, and further, the noise characteristics of the external electromagnetic environment are deteriorated.

Here, in the multilayer printed circuit board in accordance with the embodiment of the present invention, as an example shown in FIG. 1, the ground interconnection 22 connected to the ground layers 31 and 32 by the ground via 5 is used. The interconnection via 61 is formed along the ground via 5. By employing the above-mentioned constitution, a good feedback circuit was formed. As a result, even when the diameter of the clearance 7 is increased, an effect of improving the external electromagnetic environment can be maintained because the feedback circuit is formed by the interconnection 21.

Figure 6:
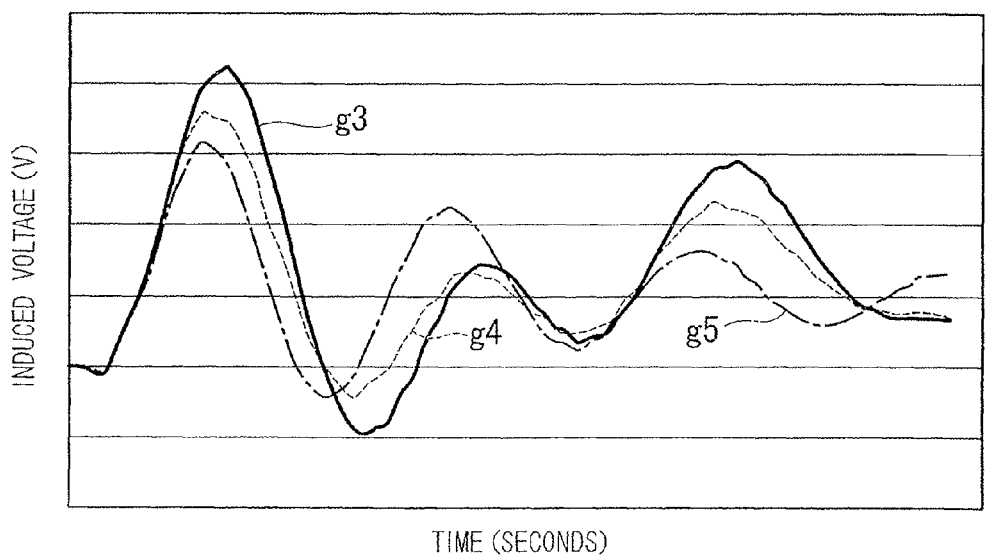
FIG. 6 is a graph relating another example of a multilayer printed circuit board in accordance with an embodiment of the present invention, showing noise overlapping caused by vias.

Numerical improvement effects of the multilayer PCB in accordance with the embodiment of the present invention will be described with reference to FIG. 6. In FIG. 6, the horizontal axis represents time (seconds), and the vertical axis represents an induced voltage (V).

In this example, on the assumption that the multilayer PCB 100 in FIG. 9 is adopted as the related art and the multilayer PCB 1 in accordance with the embodiment of the present invention is adopted as the present embodiment, the case in which the external noise 90 is applied to the multilayer PCBs 1 and 100 will be described. Here, voltages induced between ground terminals 81*b* and 115*b* and interconnection terminals 81*a* and 115*a* of the LSIs 81 and 115 are calculated.

Among three waveforms shown in FIG. 6, the waveform shown in a thick line (graph g3) is an induced voltage of the conventional multilayer PCB 100. The waveforms shown in thin lines are induced voltages of the multilayer PCB 1 in accordance with the embodiment of the present invention. Specifically, the graph g4 represents an induced voltage in a ground line disposition of this embodiment. In addition, the graph g5 represents an induced voltage in a power line disposition of this embodiment.

As in the results shown in the graph of FIG. 6, it will be appreciated that, in comparison with the case where there is no via connection shown in FIG. 5, although the induced voltage is increased, an effect of reducing the noise induction is produced to a certain extent.

Figure 7:
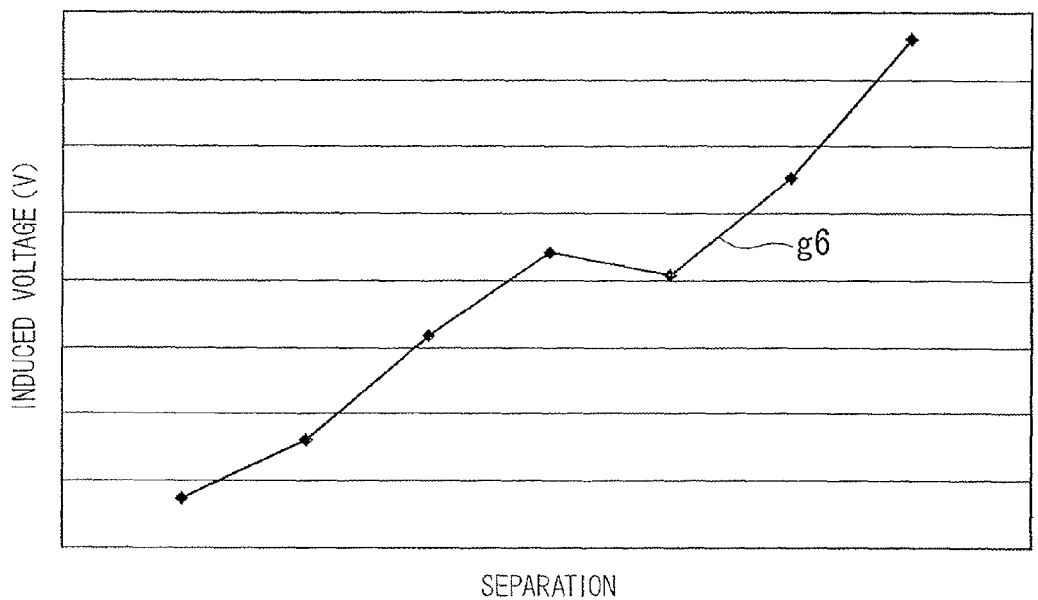
FIG. 7 is a graph relating another example of a multilayer printed circuit board in accordance with an embodiment of the present invention, showing distance dependence between vias.

In addition, a parameter of determining the noise induction reducing effect as described above is dependent on a distance between the pair of interconnection vias 61 and 62. As the distance decreases, the effect is increased. Therefore, this relationship will be described with reference to the graph of FIG. 7. FIG. 7 is the graph g6 showing results of calculating the difference between noise voltages induced between terminals of the LSI 81, as described above, by adopting the separation distance of the interconnection vias 61 and 62 as the parameter and using the electromagnetic field simulation. In FIG. 7, the horizontal axis represents a separation between the interconnection via 61 and the interconnection wire 62, and the vertical axis represents an induced voltage V.

It will be apparent from the results shown in FIG. 7 that, as the distance between the interconnection vias 61 and 62 decreases, the induced voltage is reduced. In addition, it will be apparent that, while only one point in the graph of FIG. 7 is shown as discontinuity of the effect, an entire fluctuation tendency is not greatly affected by the discontinuity, and that the above-mentioned effect is discovered.

Hereinafter, another example of the multilayer printed circuit board in accordance with the embodiment of the present invention will be described with reference to FIGS. 2 to 4. In addition, in the following description, detailed descriptions of the same constitution as the above-mentioned multilayer printed circuit board are omitted.

Figure 2:
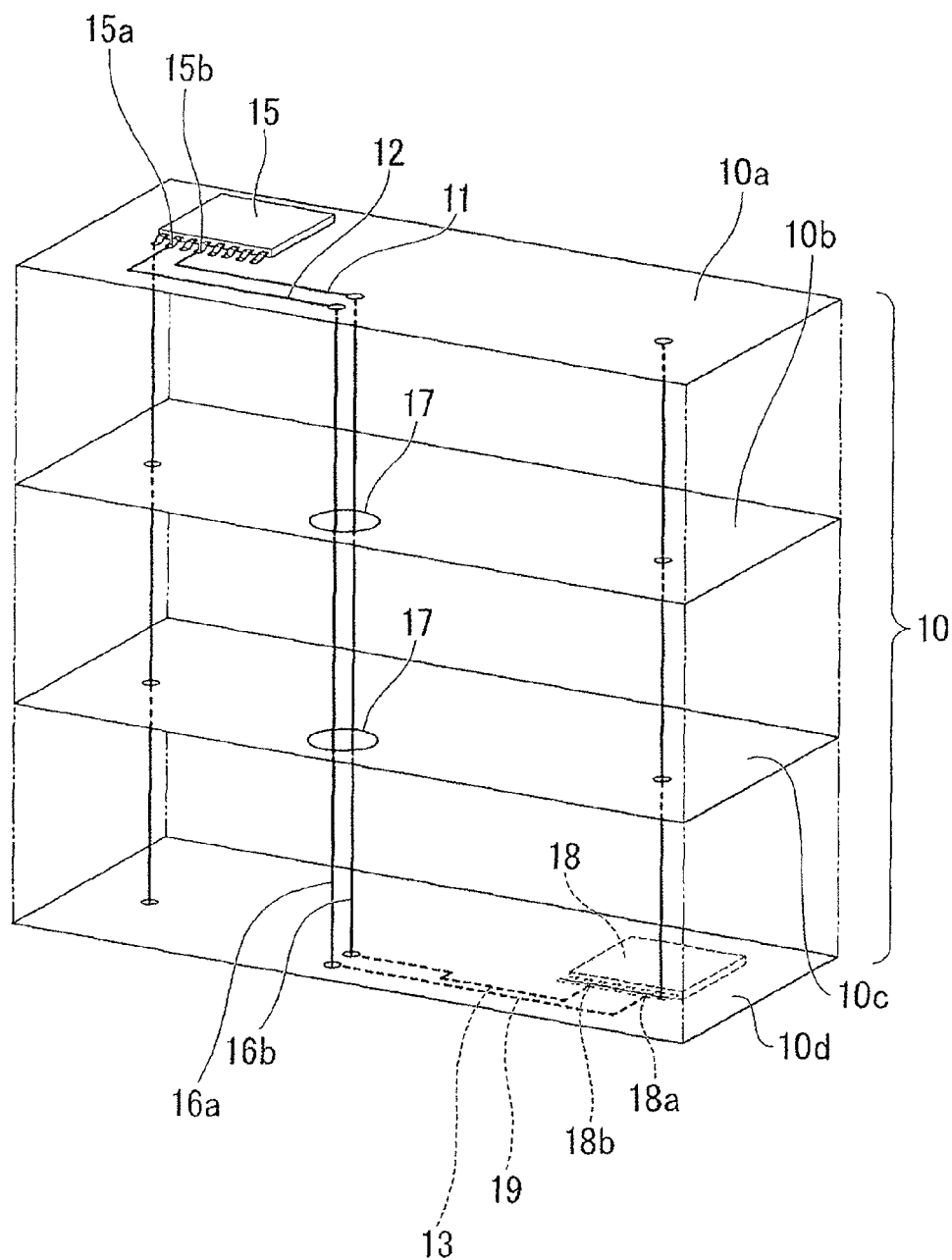
FIG. 2 is a cross-sectional view showing another example of a multilayer printed circuit board in accordance with an embodiment of the present invention, showing a layer structure.

A multilayer PCB 10 shown in FIG. 2 differs from the multilayer PCB 1 shown in FIG. 1 in that the ground interconnection 22 (see FIG. 1) is replaced with a power interconnection 12.

In the multilayer PCB 10 shown in FIG. 2, a power interconnection 12 connected to a power terminal 15a of an LSI 15 is connected to an interconnection via 16a. An example showing an effect obtained in this case is represented as a dotted line waveform (graph g4) in the graph of FIG. 6. As in the results shown in FIG. 6, it will be appreciated that the multilayer PCB 10 can obtain a certain effect, although the effect is smaller than that of the case in which the ground interconnection is used. In addition, in a printed circuit board in which power is supplied through an interconnection, it may be difficult to add an additional ground interconnection, for example, when there is no margin in an interconnection layer.

In this case, the multilayer PCB 10 of this embodiment is extremely advantageous to the case in which an interconnection density is increased, for example, the case in which the conventional power interconnection is used.

In addition, the multilayer PCB 10 of this embodiment may include at least two kinds of power sources, which are separated from each other in terms of direct current. Therefore, the power interconnection may be configured to supply at least part of the power supplied to electronic components, to which the other interconnection paired with the power interconnection is connected.

Figure 3:
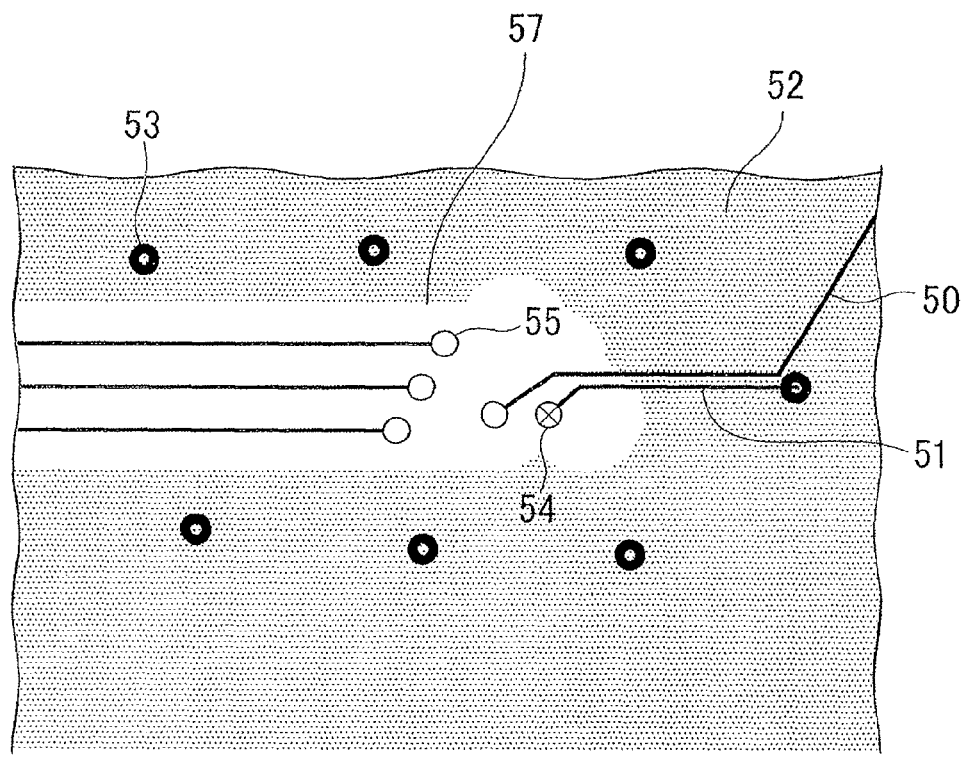
FIG. 3 is a schematic view showing another example of a multilayer printed circuit board in accordance with an embodiment of the present invention, showing a planar structure.

Next, an embodiment in which a separate interconnection is disposed at the other of the ground layers 31 and 32 as shown in FIG. 1 is illustrated in plan view of FIG. 3.

In the example shown in FIG. 3, a clearance 57 of a ground layer 52 installed so as to be connected to the other interconnection via is installed. A signal interconnection 50 and a ground interconnection 51 are connected to an interconnection via 55 and an interconnection via 54, which are adjacent to each other, respectively. Here, the ground interconnection 51 is connected to a ground via 53 at the other end thereof.

Figure 4:
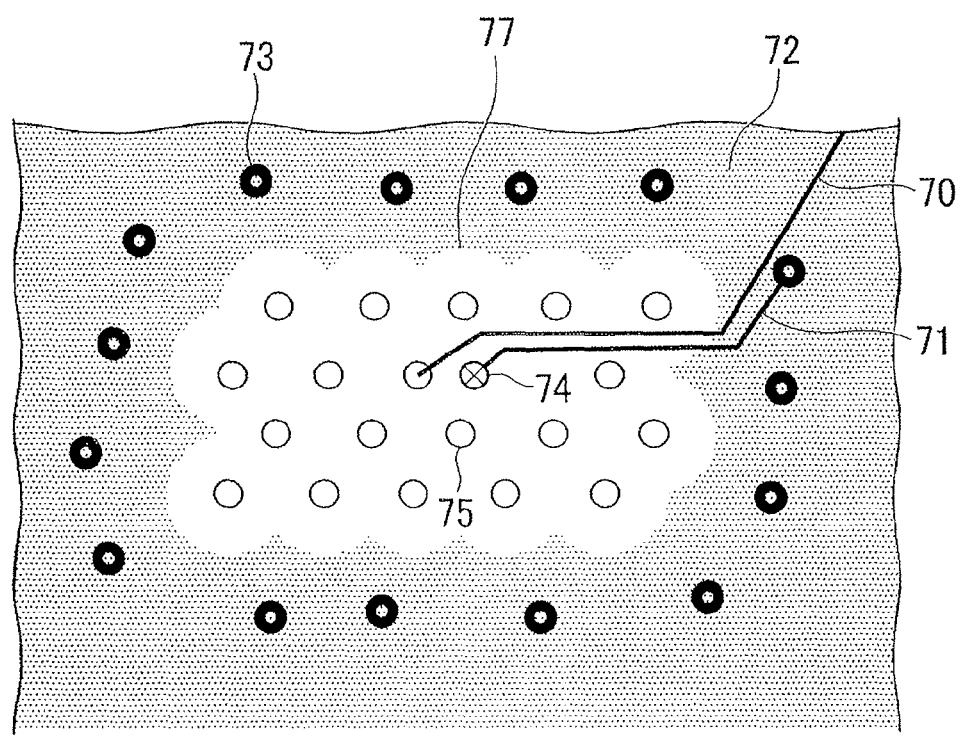
FIG. 4 is a schematic view showing another example of a multilayer printed circuit board in accordance with an embodiment of the present invention, showing a planar structure.

Moreover, while an embodiment in which a clearance 77 is shared with other interconnection vias is shown in plan view of FIG. 4, the basic constitution of this embodiment is similar to the example shown in FIG. 3.

That is, in the example shown in FIG. 4, the clearance 77 of a ground layer 72 installed to be connected to the other interconnection via is installed. A signal interconnection 70 and a ground interconnection 71 are connected to an interconnection via 75 and an interconnection via 74, which are adjacent to each other, respectively. Here, the ground interconnection 71 is connected to the ground via 73 at the other end thereof.

In addition, the multilayer printed circuit board in accordance with the embodiment of the present invention is not limited to the above-mentioned constitution. For example, as described below, a remarkable effect obtained by the embodiment of the present invention will still be more apparent by appropriately selecting a detailed constitution of the multilayer printed circuit board.

First, the multilayer PCB in accordance with the embodiment of the present invention will be described below with reference to the multilayer PCB 1 shown in FIG. 1.

The most influential factor in obtaining the effect of the embodiment of the present invention is that the interconnection via 61 be disposed along the interconnection via 62 to interconnect the signal interconnection 21 in the clearance 7 in a vertical direction. For this reason, it is necessary to dispose the interconnection via 62 using the clearance 7 equal to the clearance used by the signal interconnection 21. Next, another factor is a position relationship between the interconnection via 62 and the interconnection via 61. However, the interconnection vias 61 and 62 should come as close as possible to each other as long as they are not in contact with each other in order to obtain the best result of reducing external noise coupling.

In addition, the ground interconnection 22 connected to the interconnection via 61 is connected to the ground layers 31 and 32. This connection generally uses the ground interconnection 22 as shown in FIG. 1. However, the ground interconnection 22 need neither have a certain line width nor be in a straight line. In addition, in the example shown in FIG. 1, the other end of the interconnection via 61 is electrically connected to the ground layers 31 and 32 through the ground via 5. However, the ground interconnection 22 may be connected to the ground terminal 81b of the LSI 81. Further, while a resistor (not shown) may be inserted into the ground interconnection 22, it is necessary that the resistance value thereof be low, that is, 0Ω to several Ω.

Further, this connection method as described above is also similarly applied to the surface on which the LSI 82 is mounted.

Hereinafter, a special structure of the multilayer printed circuit board of the embodiment of the present invention will be described.

In the multilayer printed circuit board, for example, when the total length of the pair of interconnection vias is approximate to an electric field of a signal frequency interconnected using the signal interconnection, the current flowing through the interconnection via may be non-uniform. In terms of electrical design, a distributed constant circuit design may be required. In this case, it is necessary to consider characteristic impedance in consideration of a via as a transmission line. A related design parameter of determining the characteristic impedance is a gap between the pair of interconnection vias. However, unlike the above-mentioned conditions, the proximity to each via is restricted. Specifically, while the above-mentioned conditions of coming as close as possible to each via reduce external noise coupling, the characteristic impedance is not taken into consideration, and signal transmission may be disturbed. In the proximity restriction that takes the characteristic impedance into consideration, a design method of the via portion has been established and is a special requirement of the embodiment of the present invention, but it is not essential. That is, since the design method corresponds to a design step, detailed descriptions thereof are omitted.

Next, the case in which the power interconnection described in another embodiment is used will be described.

When power is supplied to the multilayer printed circuit board through the interconnection, as shown in FIG. 2, the treatment of the power interconnection 12 of the first layer and the power interconnection 19 of the fourth layer is important. Each of the LSIs 15 and 18 has the number of interconnections corresponding to the number of terminals. In FIG. 2, among the interconnections connected to the LSI 15, only the power interconnection 12 and the signal interconnection 11 are shown. Here, only the signal interconnection 11 connected to the interconnection terminal 15b can be applied to the embodiment of the present invention to reduce the external noise coupling. This is because the ground interconnection is extracted from a site that it reaches and the other ground interconnection (not shown) is easily extracted in the same manner, while the number of power interconnections shown in FIG. 2 is generally only one. That is, when the treatment in the embodiment of the present invention is performed using the power interconnection, its application range is limited. On the other hand, when the power interconnections are used and when a plurality of signal interconnections 11 corresponding thereto are provided, it is necessary to increase the number of power interconnections by branching off the power interconnection 12 of the first layer and the power interconnection 19 of the fourth layer. The case in which the power interconnection is used will be described based on such a premise.

When the signal interconnection 11 is connected to the LSI 15 and the LSI 18 by an interconnection via 16b, the difference from the embodiment using the ground interconnection is a method of connecting the power interconnection 12 of the first layer with the power interconnection 19 of the fourth layer. The interconnection via 61 is connected to the ground interconnections 22 and 42 of the multilayer printed circuit board shown in FIG. 1. In this example, the ground interconnections 22 and 42 are replaced with the power interconnections 12 and 13. The power interconnections cannot be connected to ground layers 10b and 10c. Therefore, in this case, the power interconnection 12 of the first layer is connected to a power terminal 15a of the LSI 15. Similarly, the power interconnection 13 of the fourth layer is connected to a power terminal 18a of the LSI 18. In addition, similar to the above-mentioned ground interconnection 22, a resistor of 0Ω to several Ω may be inserted into the power interconnections 12 and 13.

However, although not shown in FIG. 2, the power interconnection 12 or the power interconnection 13 is connected to at least one of the interconnections for supplying power. A connection site is the power terminal 15a of the LSI 15, the power terminal 18a of the LSI 18, or a middle portion or end of the power interconnections 12 and 19, or is provided from a layer other than the first layer or the fourth layer shown in FIG. 2. The connection site may be appropriately determined.

Next, the case in which a plurality of interconnections pass through the same clearance will be described.

While FIGS. 3 and 4 correspond to this case, the difference from the above-mentioned description is the presence of a plurality of interconnection vias 55 (75) in the same clearance 57 (77). FIGS. 3 and 4 illustrate the case in which the targeting interconnection vias 55 (75) are limited. Here, while such disposition may occur in the case of high density mounting, when the clearances 57 (77) of the interconnection vias 55 (75) are concentrated, the clearances may be superposed on one another (see FIG. 4) or may be shared as the clearance for the interconnections (see FIG. 3). In this case, this embodiment is applied to only a certain targeting signal interconnection. While the basic constitution is similar to that described above, the difference is that, besides the relevant interconnection vias 55 (75), the ground interconnection 51 (71) is not installed, and the interconnection via 54 (74) connected to the ground interconnection 51 (71) is not disposed. Even in this case, while the power interconnection may be used instead of the ground interconnection, at this time, the ground interconnection 51 (71) connected to the interconnection via 54 (74) may not be connected to the ground via 53 (73) to be replaced with the power interconnection.

In addition, in the multilayer printed circuit board of the embodiment of the present invention, when at least two interconnection vias are disposed adjacent to each other and are inserted through the clearance installed in the ground layer, the pair of interconnection vias are disposed such that any other interconnection vias are not disposed on the straight line connecting the center points of the pair of interconnection vias, and the pair of interconnection vias have a gap smaller than that of the other interconnection vias. Nevertheless, the multilayer printed circuit board is more favorable in that the effects of the embodiment of the present invention are sufficiently obtained.

As described above, according to the multilayer printed circuit board 1 in accordance with the embodiment of the present invention, the pair of interconnection vias 61 and 62 for interlayer connection are inserted through the same clearance 7 installed in the ground layers 31 and 32. One of the pair of interconnection vias 61 and 62 is connected to the ground layers 31 and 32 of the inner layer by the ground interconnection 22. For this reason, it is possible to form a good feedback circuit and suppress induction of noise caused by external noise such as electrostatic noises, or the like. Therefore, the noise discharge to the exterior can be reduced to improve noise characteristics to an external electronic environment, and further, it is possible to provide an electronic device having good resistance to external noises. In addition to the effect, it is not necessary to add electronic components, and thus, the number of components can be reduced. For this reason, it is possible to realize the multilayer printed circuit board 1 capable of providing improved immunity characteristics at a low cost with a reduction of space, and without need for residual energy.

INDUSTRIAL APPLICABILITY

According to a multilayer printed circuit board in accordance with an embodiment of the present invention, it is possible to provide the multilayer printed circuit board capable of substantially reducing affection by external noise such as electronic discharge noises. For this reason, when such multilayer printed circuit boards are used in various electronic devices, or the like, it is possible to provide electronic devices capable of increasing resistance to external noises. In addition, it is possible to develop a design technique or an automatic design program using the technique of the embodiment of the present invention.

The invention claimed is:

1. A multilayer printed circuit board, comprising:
a signal interconnection which transmits and receives an electrical signal between electronic components;
a ground interconnection connected to a ground of a circuit;
a power interconnection connected to a power layer to supply power to the electronic components;
at least one ground layer installed in an inner layer;
at least one clearance which passes through the ground layer; and
a ground via which connects the ground interconnection with the ground layer,
wherein the signal interconnection and the ground interconnection or the signal interconnection and the power interconnection are installed in a pair, and
a pair of interconnection vias for interlayer connection are inserted through the clearance installed in the ground layer so that one of the pair of interconnection vias is connected to the ground layer by the ground interconnection.

2. The multilayer printed circuit board according to claim 1, wherein the multilayer printed circuit board comprises at least two kinds of power sources separated in terms of direct current, and the power interconnection supplies at least part of power supplied to the electronic component to which the other interconnection paired with the power interconnection is connected.

3. The multilayer printed circuit board according to claim 1, wherein, when at least two interconnection vias are disposed adjacent to each other and are inserted through the clearance installed in the ground layer, the pair of interconnection vias are disposed with the other interconnection vias being not disposed in a straight line connecting center points of the pair of interconnection vias, and the pair of interconnection vias have a gap smaller than that of the other interconnection vias.

* * * * *